United States Patent
Furukawa et al.

(10) Patent No.: US 7,923,202 B2
(45) Date of Patent: Apr. 12, 2011

(54) LAYER PATTERNING USING DOUBLE EXPOSURE PROCESSES IN A SINGLE PHOTORESIST LAYER

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 761 days.

(21) Appl. No.: 11/831,099

(22) Filed: Jul. 31, 2007

(65) Prior Publication Data
US 2009/0035708 A1   Feb. 5, 2009

(51) Int. Cl.
*G03F 7/26* (2006.01)
(52) U.S. Cl. .......... 430/324; 430/394; 430/330
(58) Field of Classification Search .......... 430/312, 430/322, 394, 330, 315, 314
See application file for complete search history.

(56) References Cited

U.S. PATENT DOCUMENTS

| | | | | |
|---|---|---|---|---|
| 4,394,437 A * | 7/1983 | Bergendahl et al. | .......... | 430/312 |
| 4,568,631 A * | 2/1986 | Badami et al. | .......... | 430/315 |
| 6,171,761 B1 * | 1/2001 | Minamide et al. | .......... | 430/313 |
| 6,218,089 B1 * | 4/2001 | Pierrat | .......... | 430/394 |
| 6,632,590 B1 * | 10/2003 | Tzu et al. | .......... | 430/311 |
| 2007/0212654 A1 * | 9/2007 | Larson et al. | .......... | 430/322 |

* cited by examiner

*Primary Examiner* — Kathleen Duda
*Assistant Examiner* — Caleen O Sullivan
(74) *Attorney, Agent, or Firm* — Schmeiser, Olsen & Watts; Katherine Brown

(57) ABSTRACT

A structure and a method for forming the same. The method includes providing a structure which includes (a) a to-be-patterned layer, (b) a photoresist layer on top of the to-be-patterned layer wherein the photoresist layer includes a first opening, and (c) a cap region on side walls of the first opening. A first top surface of the to-be-patterned layer is exposed to a surrounding ambient through the first opening. The method further includes performing a first lithography process resulting in a second opening in the photoresist layer. The second opening is different from the first opening. A second top surface of the to-be-patterned layer is exposed to a surrounding ambient through the second opening.

11 Claims, 4 Drawing Sheets

LAYER PATTERNING USING DOUBLE EXPOSURE PROCESSES IN A SINGLE PHOTORESIST LAYER

FIELD OF THE INVENTION

The present invention relates generally to layer patterning and more particularly to layer patterning using double exposure processes in a single photoresist layer.

BACKGROUND OF THE INVENTION

In conventional double exposure processes, because the two exposure conditions are superimposed, the pattern fidelity is significantly degraded. Therefore, there is a need for a structure (and a method for forming the same) in which the double exposure processes can be carried out with pattern fidelity higher than that of the prior art.

SUMMARY OF THE INVENTION

The present invention provides a structure fabrication method, comprising providing a structure which includes (a) a to-be-patterned layer, (b) a photoresist layer on top of the to-be-patterned layer wherein the photoresist layer includes a first opening, and (c) a cap region on side walls of the first opening, wherein a first top surface of the to-be-patterned layer is exposed to a surrounding ambient through the first opening; and then performing a first lithography process resulting in a second opening in the photoresist layer, wherein the second opening is different from the first opening, and wherein a second top surface of the to-be-patterned layer is exposed to a surrounding ambient through the second opening.

The present invention provides a structure (and a method for forming the same) in which the double exposure processes can be carried out with pattern fidelity higher than that of the prior art.

DETAILED DESCRIPTION OF THE INVENTION

Figure 1A:
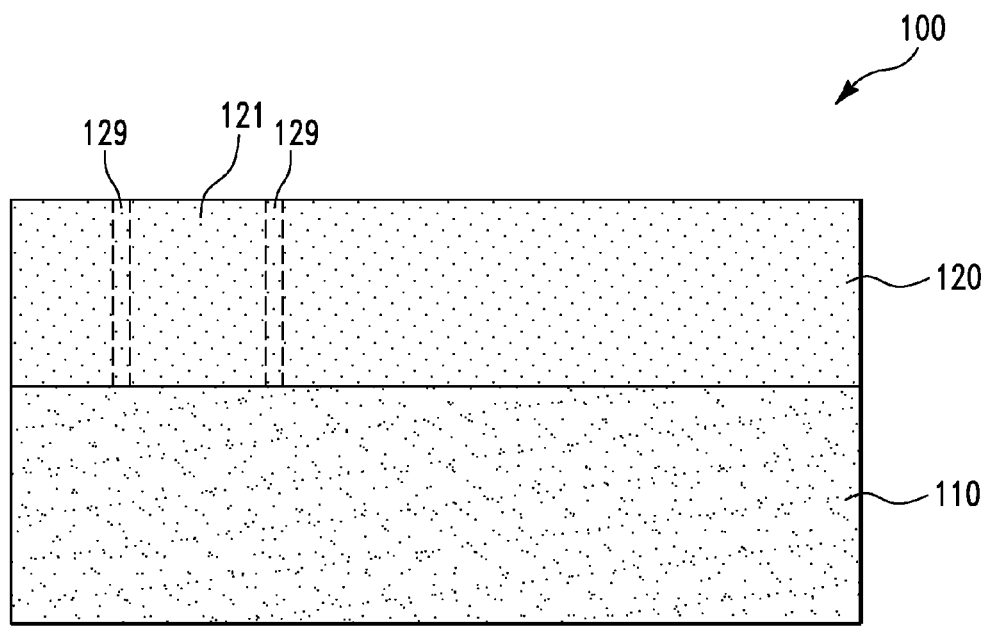
FIGS. 1A-1G show cross-section views used to illustrate a fabrication process of a semiconductor structure, in accordance with embodiments of the present invention.

FIGS. 1A-1G show cross-section views used to illustrate a fabrication process of a semiconductor structure 100, in accordance with embodiments of the present invention. More specifically, with reference to FIG. 1A, the fabrication process of the semiconductor structure 100 starts with a to-be-patterned layer 110. Next, a photoresist layer 120 is formed on top of the to-be-patterned layer 110. The photoresist layer 120 can be formed by a spin-on process followed by baking (called a post spin-on baking process).

In one embodiment, assume that positive-tone lithography hereafter is used. Positive-tone lithography means that after a photoresist layer is exposed to light through a reticle (not shown), regions of the photoresist layer exposed to light are developed away while other regions of the photoresist layer not exposed to light remain.

Next, in one embodiment, the photoresist layer 120 is exposed to light (called a first exposure process) through a first reticle (not shown, but typically placed over the photoresist layer 120). The reticle contains clear and opaque features such that a region 121 of the photoresist layer 120 is exposed to light while other regions of the photoresist layer 120 are not exposed to light.

In one embodiment, the first exposure process also includes, after the photoresist layer 120 is exposed to light, baking the structure 100 at a high temperature (called a first post exposure baking process). During the first post exposure baking process, photo acids created in the region 121 as a result of the first exposure process chemically react with the photoresist material of the photoresist region 121 causing the region 121 to change from insoluble to soluble in a photoresist developer.

Figure 1B:
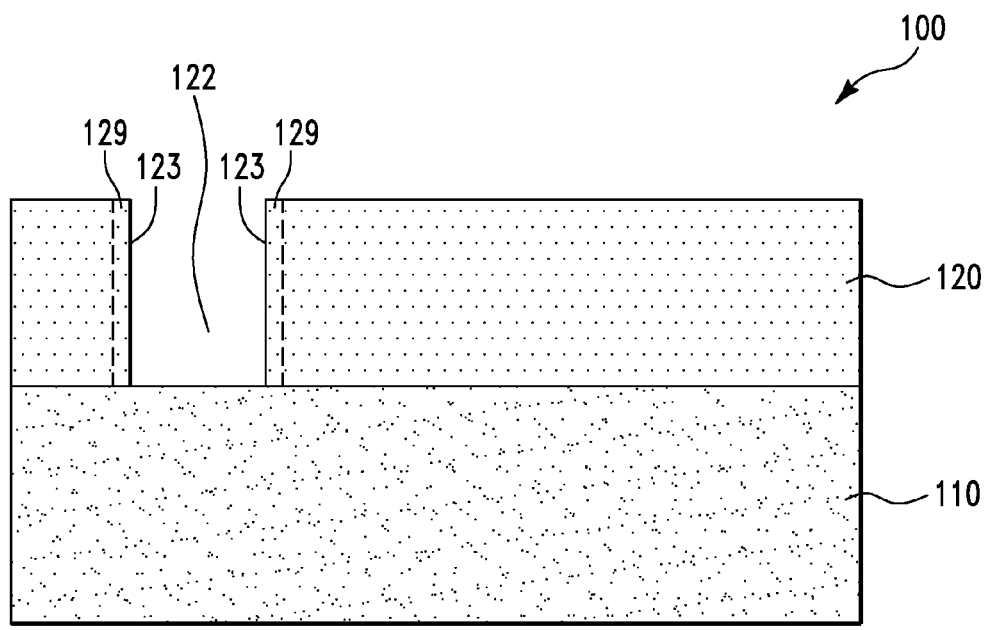

Next, in one embodiment, the photoresist developer is used to develop away (remove) the exposed-to-light region 121 (FIG. 1A) of the photoresist layer 120 (called a first development process) resulting in a photoresist hole 122 in the patterned photoresist layer 120, as shown in FIG. 1B.

It should be noted that, with reference to FIG. 1A, during the first exposure process, the intensity of energy reaching the photoresist layer 120 is at its highest at the center of the region 121 and decays toward the perimeter of the region 121. As a result, a region 129 abutting the region 121 does not attain an acid concentration level required for inducing photoresist development. Therefore, when the region 121 is later removed, the region 129 remains and contains some photo acids (called residual photo acids).

Figure 1C:
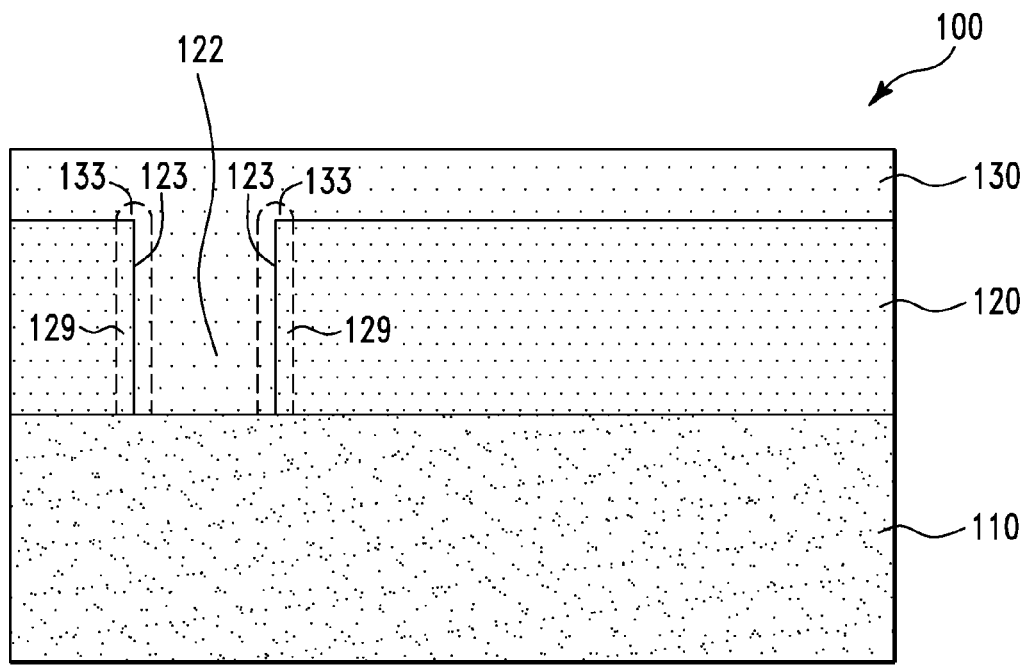

Next, with reference to FIG. 1C, in one embodiment, a cap layer 130 is formed on top of the entire structure 100 of FIG. 1B by, illustratively, a spin-on process such that the cap layer 130 completely fills the photoresist hole 122.

In one embodiment, the cap layer 130 comprises a material which, when coming into direct physical contact with the residual photo acids at a high temperature, becomes (i) insoluble in a post capping rinse chemical (e.g., water) and (ii) capable of withstanding a subsequent development of the photoresist layer 120 during the formation of a photoresist hole 126 (FIG. 1F) in the photoresist layer 120. More specifically, in one embodiment, the cap layer 130 comprises a water-soluble polymer (or alcohol-soluble polymer) and can be formed by spin-applying the water-soluble polymer on top of the entire structure 100 of FIG. 1B.

Next, in one embodiment, the structure 100 is baked to an elevated temperature such that the residual photo acids in the region 129 diffuse into cap regions 133 of the cap layer 130 via the side walls 123. At the elevated temperature, the diffused residual photo acids in the cap regions 133 catalyze cross-linking reactions (i.e., polymerization) in the cap regions 133 causing the cap regions 133 to change from originally soluble to insoluble in the above-mentioned post capping rinse chemical.

Figure 1D:
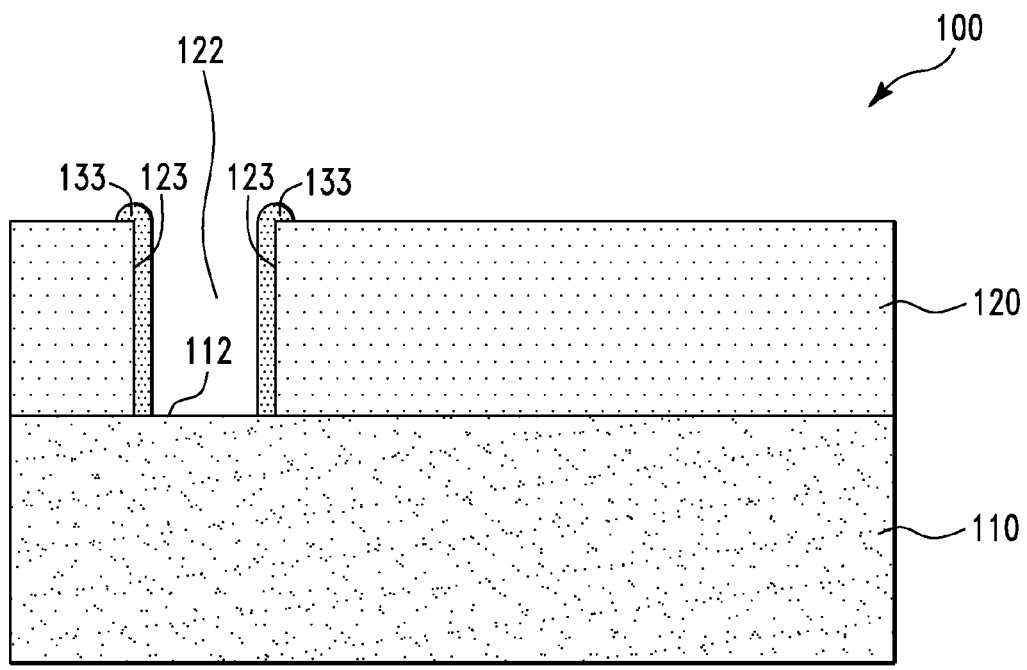

Next, in one embodiment, the post capping rinse chemical is used to remove the entire cap layer 130 except the insoluble cap regions 133 such that the photoresist hole 122 is reopened and such that the top surface 112 of the to-be-patterned layer 110 is again exposed to the surrounding ambient through the reopened photoresist hole 122 as shown in FIG. 1D. This process can be referred to as the post capping rinse. After the post capping rinse, the resulting cap regions 133 cover the side walls of the original photoresist hole 122.

Figure 1E:
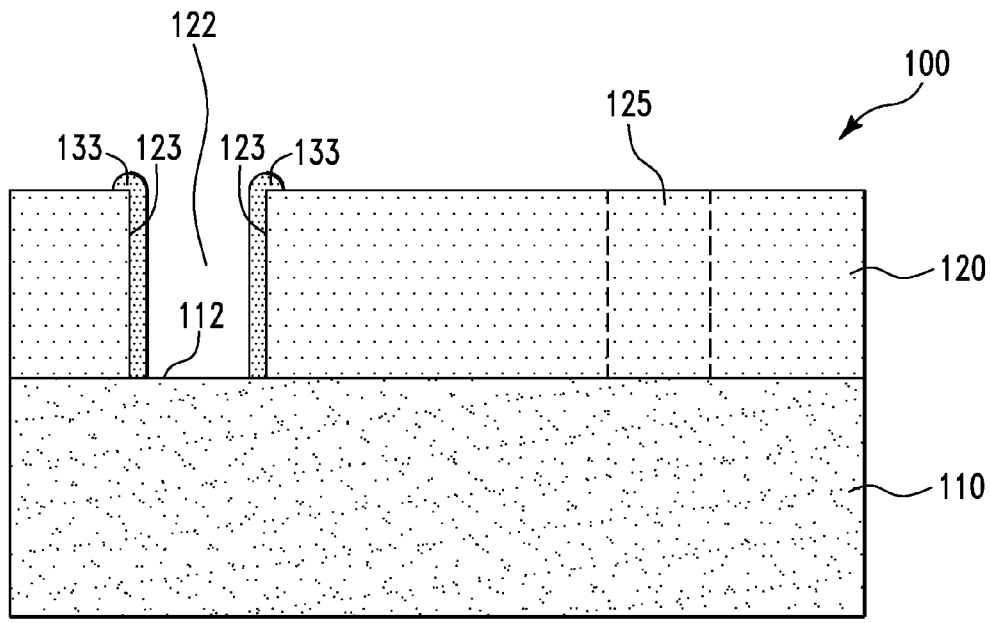

Next, with reference to FIG. 1E, in one embodiment, the photoresist layer 120 is exposed to light (called a second exposure process) through a second reticle (not shown, but typically placed over the photoresist layer 120). The second reticle contains clear and opaque features such that a region 125 of the photoresist layer 120 is exposed to light while other regions of the photoresist layer 120 are not exposed to light.

In one embodiment, the second exposure process also includes, after the photoresist layer 120 is exposed to light, baking the structure 100 at a high temperature (called a second post exposure baking process). During the second post exposure baking process, photo acids created in the region 125 as a result of the second exposure process chemically react with the photoresist material of the photoresist region 125 causing the photoresist region 125 to change from insoluble to soluble in the photoresist developer (which was used in the first development process).

Figure 1F:
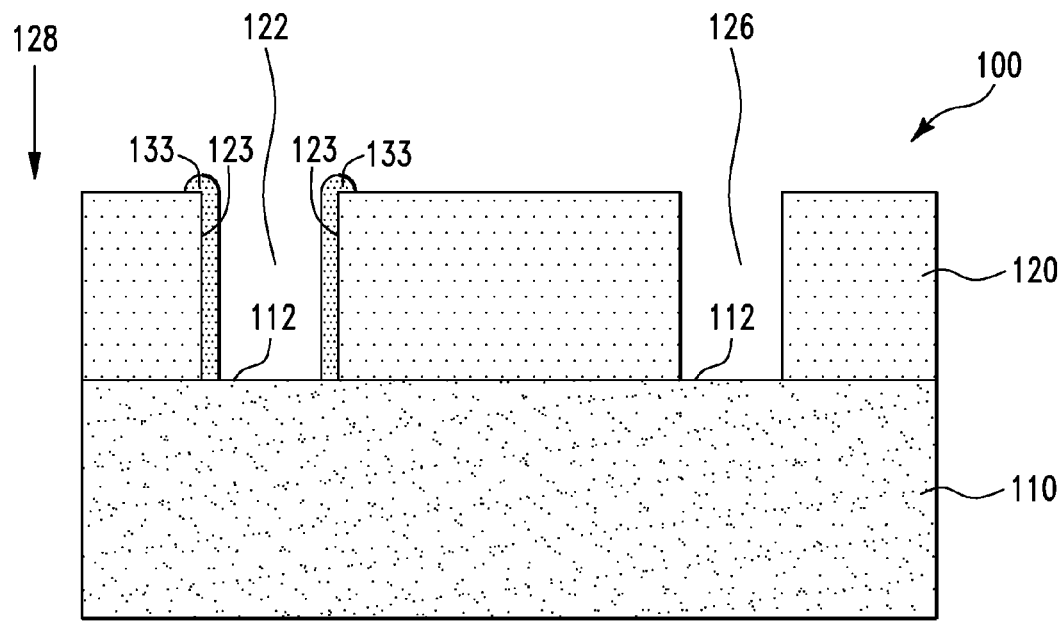

Next, in one embodiment, the photoresist developer is used to develop away (remove) the exposed-to-light region 125 (FIG. 1E) of the photoresist layer 120 (called a second development process) resulting in a photoresist hole 126 in the patterned photoresist layer 120, as shown in FIG. 1F. The top surface 112 of the to-be-patterned layer 110 is exposed to the surrounding ambient through the photoresist hole 126. It should be noted that the cap regions 133 are insoluble in the photoresist developer. As a result, the side walls 123 of the original photoresist hole 122 are protected by the insoluble cap regions 133 from the second development process.

Figure 1G:
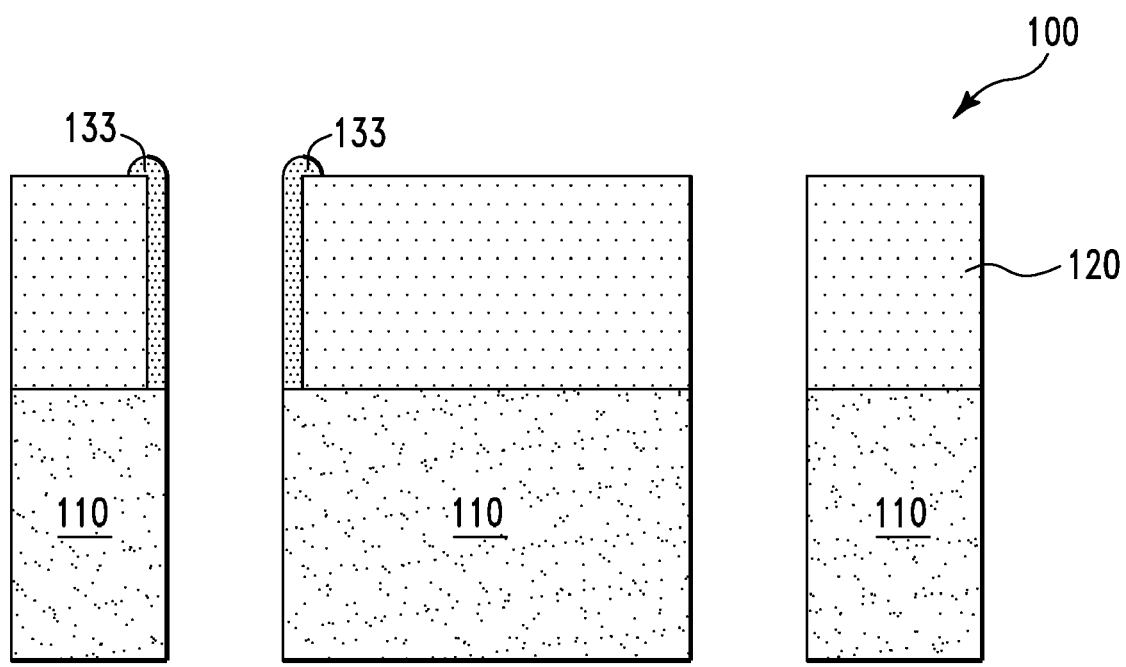

Next, in one embodiment, the to-be-patterned layer 110 is anisotropically (in the direction defined by arrows 128) etched with the patterned photoresist layer 120 as a blocking mask resulting in the structure 100 of FIG. 1G.

In the embodiments described above, the same photoresist developer is used for both the first and second development processes. In general, different photoresist developers can be used in the first and second development processes, provided that the cap regions 133 are able to withstand the second development process.

In the embodiments described above, the first and second lithography processes (that formed the original photoresist hole 122 of FIG. 1B and the photoresist hole 126 of FIG. 1F, respectively) are positive-tone lithography. In general, each of the first and second lithography processes can be either positive-tone lithography or negative-tone lithography, provided that the cap regions 133 are able to withstand the second development process of the second lithography process.

In summary, because the cap regions 133 are insoluble in the photoresist developer which is used in the second development process of the second lithography process, the cap regions 133 protect the side walls 123 of the photoresist hole 122 from the second development process of the second lithography process. In other words, the photoresist hole 122 which is formed in the first development process of the first lithography process is subsequently protected from the second development process of the second lithography process.

With reference to FIG. 1F, in the embodiments described above, the first and second lithography processes are in turn performed in which the cap regions 133 are used to protect the side walls/edges 123 of the photoresist hole 122 (created by the first lithography process) from the second lithography process. In an alternative embodiment, the cap regions 133 are not formed, and the first and second lithography processes are in turn performed such that the side walls/edges 123 of the photoresist hole 122 (resulting from the first lithography process) are not significantly affected by the second lithography process.

More specifically, assume that the first lithography process is performed using a first dose of exposure light for the first exposure process and a first post expose bake temperature for the first post exposure baking process. Assume further that the second lithography process is performed using a second dose of exposure light for the second exposure process and a second post expose bake temperature for the second post exposure baking process. The inventors of the present invention have found that, if the first dose of exposure light is lower (or higher) than the second dose of exposure light and if the first post expose bake temperature is higher (or lower) than the second post expose bake temperature, then the side walls 123 of the photoresist hole 122 resulting from the first lithography process are affected by the second lithography process at a lower degree than in the case in which both the first and second lithography processes are performed in the same conditions. For example, if (i) the first dose of exposure light is 25 mj and the first post expose bake temperature is 125° C. and if (ii) the second dose of exposure light is 80 mj and the second post expose bake temperature is 90° C., then the side walls 123 of the photoresist hole 122 resulting from the first lithography process are affected by the second lithography process at a lower degree than in the case in which both the first and second lithography processes are performed using the same first dose of exposure light and at the same first post expose bake temperature (or using the same second dose of exposure light and at the same second post expose bake temperature).

In the embodiments described above, the first and second lithography processes are different with respect to dose of exposure light and post expose bake temperature. In an alternative embodiment, the first and second lithography processes are different with respect to dose of exposure light and developer concentration. Developer concentration is the concentration of a developer used in a development process.

More specifically, assume that the first lithography process is performed using a third dose of exposure light for the first exposure process and a first developer concentration for the first development process. Assume further that the second lithography process is performed using a fourth dose of exposure light for the second exposure process and a second developer concentration for the second development process. The inventors of the present invention have found that, if the third dose of exposure light is lower (or higher) than the fourth dose of exposure light and if the first developer concentration is higher (or lower) than the second developer concentration, then the side walls 123 of the photoresist hole 122 resulting from the first lithography process are affected by the second lithography process at a lower degree than in the case in which both the first and second lithography processes are performed in the same conditions. For example, if (i) the third dose of exposure light is 25 mj and the first developer is tetramethylammonium hydroxide (TMAH) with concentration of 0.26 N and if (ii) the fourth dose of exposure light is 80 mj and the second developer is TMAH with a weaker concentration than the first developer concentration such as 0.14 N, then the side walls 123 of the photoresist hole 122 resulting from the first lithography process are affected by the second lithography process at a lower degree than are in the case in which both the first and second lithography processes are performed using the same third dose of exposure light and the same first developer concentration (or using the same fourth dose of exposure light and the same second developer concentration).

In the embodiments described above, the first and second lithography processes are (i) different with respect to dose of exposure light and post expose bake temperature and (ii) different with respect to dose of exposure light and developer concentration. In an alternative embodiment, the first and second lithography processes are different with respect to post expose bake temperature and developer concentration.

More specifically, assume that the first lithography process is performed using a third post expose bake temperature for the first post exposure baking process and a third developer concentration for the first development process. Assume further that the second lithography process is performed using a fourth post expose bake temperature for the second post exposure baking process and a fourth developer concentration for the second development process. The inventors of the present invention have found that, if the third post expose bake temperature is lower (or higher) than the fourth post expose bake temperature and if the third developer concentration is higher (or lower) than the fourth developer concentration, then the side walls 123 of the photoresist hole 122 resulting from the first lithography process are affected by the second lithography process at a lower degree than in the case in which both the first and second lithography processes are performed in the same conditions. For example, if (i) the third post bake temperature is 90° C. and the third developer is TMAH with concentration of 0.26 N and if (ii) the fourth post bake temperature is 125° C. and the fourth developer is TMAH with a weaker concentration than the first developer concentration such as 0.14 N, then the side walls 123 of the photoresist hole 122 resulting from the first lithography process are affected by the second lithography process at a lower degree than in the case in which both the first and second lithography processes are performed using the same third post expose bake temperature and the same third developer concentration (or using the same fourth post expose bake temperature and the same fourth developer concentration).

In summary, by performing the first and second lithography processes at different values for parameters such as dose of exposure light, post expose bake temperature, and developer concentration, the side walls 123 of the photoresist hole 122 resulting from the first lithography process are affected by the second lithography process at a lower degree than in the case in which both the first and second lithography processes are performed in the same conditions.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure fabrication method, comprising:
    forming a structure which includes (a) a to-be-patterned layer, (b) a photoresist layer on top of the to-be-patterned layer wherein the photoresist layer includes a first opening, and (c) a cap region on side walls of the first opening, wherein a first top surface of the to-be-patterned layer is exposed to a surrounding ambient through the first opening, wherein said forming the structure comprises:
        providing the to-be-patterned layer,
        forming the photoresist layer on and in direct physical contact with the to-be-patterned layer wherein the photoresist layer comprises a photoresist material,
        performing a first lithography process on the photoresist layer by: selectively exposing the first region to light to make the first region soluble in a first photoresist developer; and exposing the structure to the first photoresist developer to form the first opening in the first region by the first photoresist developer developing away the photoresist material in the first region,
        forming a cap layer on top of the photoresist layer such that the cap layer fills the first opening wherein the cap layer comprises a first portion on the side walls of the first opening, and
        baking the cap layer resulting in residual photo acids diffusing from the photoresist layer into the first portion of the cap layer which transforms the first portion of the cap layer into the cap region; and
    after said forming the structure, performing a second lithography process by: selectively exposing a second region to light to make the second region soluble in a second photoresist developer and exposing the structure to the second photoresist developer to form a second opening in the second region by the second photoresist developer developing away the photoresist material in the second region, wherein the cap region is insoluble in the second photoresist developer and is not developed away by the second photoresist developer when exposed to the second photoresist developer via said exposing, wherein the first region and the second region are in distinctly different locations within the photoresist layer, and wherein a second top surface of the to-be-patterned layer is exposed to the surrounding ambient through the second opening.

2. The method of claim 1, wherein the first photoresist developer and the second photoresist developer are a same photoresist developer.

3. The method of claim 1, wherein the first photoresist developer and the second photoresist developer are different photoresist developers.

4. The method of claim 1, said method further comprising:
    anisotropically etching the to-be-patterned layer through the first opening and through the second opening to form a third opening in the to-be-patterned layer and a fourth opening in the to-be-patterned layer, respectively, wherein the first opening in the photoresist layer and the third opening in the to-be-patterned layer collectively forms a first continuous through hole through the entire thickness of the structure, and wherein the second opening in the photoresist layer and the fourth opening in the to-be-patterned layer collectively forms a second continuous through hole through the entire thickness of the structure.

5. A structure fabrication method, comprising:
    providing a structure which includes a to-be-patterned layer;
    forming a photoresist layer on top of the to-be-patterned layer;
    forming a first opening in the photoresist layer, wherein said forming the first opening is performed under a first value of a first parameter and a first value of a second parameter; and
    after said forming the first opening, forming a second opening in the photoresist layer, wherein said forming the second opening is performed under a second value of the first parameter and a second value of the second parameter, wherein the first value of the first parameter is lower than the second value of the first parameter, and wherein the first value of the second parameter is higher than the second value of the second parameter,
    wherein said forming the first opening comprises:
        exposing the photoresist layer to light at a first dose of exposure light;
        after said exposing the photoresist layer to light at the first dose, baking the photoresist layer at a first post expose bake temperature; and
        after said baking the photoresist layer at the first post expose bake temperature, developing the photoresist layer with a first photoresist developer having a first developer concentration, wherein said forming the second opening comprises:
        exposing the photoresist layer to light at a second dose of exposure light, after said exposing the photoresist layer to light at the second dose, baking the photoresist layer at a second post expose bake temperature, and after said baking the photoresist layer at the second post expose bake temperature, developing the photoresist layer with a second photoresist developer having a second developer concentration.

6. The method of claim 5, further comprising, after said forming the second opening is performed, patterning the to-be-patterned layer with the photoresist layer as a blocking mask.

7. The method of claim 5,
wherein the first parameter is dose of exposure light,
wherein the first value of the first parameter is the first dose of exposure light,
wherein the second value of the first parameter is the second dose of exposure light,
wherein the second parameter is post expose bake temperature,
wherein the first value of the second parameter is the first post expose bake temperature, and
wherein the second value of the second parameter is the second post expose bake temperature.

8. The method of claim 5,
wherein the first parameter is dose of exposure light,
wherein the first value of the first parameter is the first dose of exposure light,
wherein the second value of the first parameter is the second dose of exposure light,
wherein the second parameter is developer concentration,
wherein the first value of the second parameter is the first developer concentration, and
wherein the second value of the second parameter is the second developer concentration.

9. The method of claim 5,
wherein the first parameter is post expose bake temperature,
wherein the first value of the first parameter is the first post expose bake temperature,
wherein the second value of the first parameter is the second post expose bake temperature,
wherein the second parameter is developer concentration,
wherein the first value of the second parameter is the first developer concentration, and
wherein the second value of the second parameter is the second developer concentration.

10. The method of claim 5, wherein the first photoresist developer and the second photoresist developer are a same photoresist developer.

11. The method of claim 5, wherein the first photoresist developer and the second photoresist developer are different photoresist developers.

* * * * *